United States Patent
Umeno

(10) Patent No.: US 9,955,609 B2
(45) Date of Patent: Apr. 24, 2018

(54) ELECTRONIC CONTROL DEVICE

(71) Applicant: DENSO CORPORATION, Kariya, Aichi-pref. (JP)

(72) Inventor: Masafumi Umeno, Kariya (JP)

(73) Assignee: DENSO CORPORATION, Kariya (JP)

( * ) Notice: Subject to any disclaimer, the term of this patent is extended or adjusted under 35 U.S.C. 154(b) by 246 days.

(21) Appl. No.: 14/995,234

(22) Filed: Jan. 14, 2016

(65) Prior Publication Data
US 2016/0236125 A1 Aug. 18, 2016

(30) Foreign Application Priority Data
Feb. 18, 2015 (JP) .................. 2015-029408

(51) Int. Cl.
*H05K 5/00* (2006.01)
*H05K 7/20* (2006.01)
*H05K 5/02* (2006.01)

(52) U.S. Cl.
CPC ....... *H05K 7/20181* (2013.01); *H05K 5/0026* (2013.01); *H05K 5/0213* (2013.01); *B01D 2279/35* (2013.01)

(58) Field of Classification Search
CPC .......... H05K 7/00–7/20954; H05K 5/00–5/06; B01D 2279/35
USPC .......... 454/275–283; 55/385.2, 502
See application file for complete search history.

(56) References Cited

U.S. PATENT DOCUMENTS

| 2008/0074840 A1 | 3/2008 | Suzuki |
| 2009/0047890 A1* | 2/2009 | Yano .................... B65D 77/225 454/143 |
| 2014/0041520 A1 | 2/2014 | Daimon et al. |

FOREIGN PATENT DOCUMENTS

| JP | 2010-012842 A | 1/2010 |
| JP | 2011-165748 A | 8/2011 |
| JP | 2014-120579 A | 6/2014 |

* cited by examiner

*Primary Examiner* — T. Bennett McKenzie
(74) *Attorney, Agent, or Firm* — Posz Law Group, PLC

(57) ABSTRACT

An electronic control device has a housing and an air breathing filter assembled to a through-hole of the housing. The air breathing filter has a filter supporting member and a filter cover member. A cylindrical portion of the filter supporting member is inserted into the through-hole from an inside space of the housing, while the filter cover member is fixed to the cylindrical portion of the filter supporting member from an outside of the housing. A pushing portion is formed in a leg portion of the filter cover member for pushing a wall of the housing in a downward direction. A water-proof sealing member is interposed between an inner wall surface of the housing and a flanged portion of the filter supporting member, so that a gap between the housing and the air breathing filter is surely sealed.

6 Claims, 9 Drawing Sheets

COMPARISON EXAMPLE

COMPARISON EXAMPLE

ELECTRONIC CONTROL DEVICE

CROSS REFERENCE TO RELATED APPLICATION

This application is based on Japanese Patent Application No. 2015-29408 filed on Feb. 18, 2015, the disclosure of which is incorporated herein by reference.

FIELD OF TECHNOLOGY

The present disclosure relates to an electronic control device.

BACKGROUND

An electronic control device having air ventilation characteristic and water-proof property has been available in a field of automotive parts. In an electronic control device, for example, as disclosed in Japanese Patent Publication No. 2008-78506, a through-hole is formed in a housing of a water-proof structure. A cylindrical pipe portion of an air breathing filter is inserted into the through-hole. A passage formed in the cylindrical pipe portion works as an air ventilation passage. A water-shedding film is attached to the cylindrical pipe portion so as to cover the air ventilation passage, so that air can pass through the water-shedding film but water cannot pass through the water-shedding film from an outside of the housing. In addition, a water-proof sealing member is provided between a flanged portion of the air breathing filter and an outer wall surface of the housing, in order that the water may not enter an inside of the electronic control device via a gap between the air breathing filter and the housing.

In recent years, requirements for the air breathing filter have become higher. In particular, a structure for the air breathing filter, which can withstand a strong external force, is required. For example, since a high-pressure washing machine has been widely used in recent years, water having a strong force may hit against an outside wall of the electronic control device. Therefore, it is necessary for the air breathing filter to maintain high water-proof property even in such a circumstance, in which the high-pressure water is used.

However, in the above conventional air breathing filter, the water-proof sealing member is arranged at an outside of the housing in order to prevent the water from entering the inside of the housing via the gap between the housing and the air breathing filter. In other words, a sealing structure being composed of the water-proof sealing member and its related parts is exposed to the outside of the housing. As a result, the external force (for example, the high-pressure water from the high-pressure washing machine) may be directly applied to the sealing structure.

According to the air breathing filter of the above prior art (JP 2008-78506), the water-proof sealing member (an O-ring 70) is interposed between the flanged portion 53 of the air breathing filter 50 and an outer wall surface of the housing (a flat surface portion 61) in a tight contact condition, in order to prevent the water from entering a small gap formed between an inner wall surface of the through-hole 63 and an outer peripheral surface of the cylindrical pipe portion 55. According to the above structure, however, since the water-proof sealing member (the O-ring 70) and the flanged portion 53 are exposed to the outside of the housing, the external force (such as, the high-pressure water, or the like) is directly applied to the air breathing filter 50. Then, a portion of the air breathing filter 50 neighboring to the water-proof sealing member and/or the flanged portion may be displaced or deformed by such an external force. When such a displacement and/or a deformation occurs, the tight contact condition of the water-proof sealing member is changed to a condition in which the water-proof sealing member is no longer in the tight contact with the outer wall surface of the housing and/or the flanged portion. Then, the water may enter the inside of the housing via such a portion, at which the tight contact condition is lost.

SUMMARY OF THE DISCLOSURE

The present disclosure is made in view of the above problem. It is an object of the present disclosure to provide an electronic control device, which can sufficiently bring out a water-proof function even in a circumstance that an external force is applied to a portion of the electronic control device neighboring to an air breathing filter.

According to one of features of the present disclosure, an electronic control device has a housing of a water-proof structure, a through-hole formed in a wall of the housing so as to communicate an inside space formed in the housing to an outside of the housing, and an air breathing filter assembled to the housing.

The air breathing filter is composed of;
(a) a filter supporting member,
(b) a water-shedding film,
(c) a filter cover member, and
(d) a water-proof sealing member.

The filter supporting member has;
(a1) a cylindrical portion formed in a cylindrical shape and having an air passage formed inside of the cylindrical portion and extending in an axial direction of the cylindrical portion;
(a2) a fitting portion formed in an outer peripheral surface of the cylindrical portion at a position close to a first axial end (an upper side) of the cylindrical portion; and
(a3) a flanged portion formed at a second axial end (a lower side) of the cylindrical portion and extending in a radial-outward direction of the cylindrical portion from the outer peripheral surface of the cylindrical portion.

The water-shedding film is attached to the first axial end (the upper side) of the cylindrical portion so as to close an open end of the air passage.

The filter cover member, which is fixed to the filter supporting member, is composed of;
(c1) a cover plate portion covering the water-shedding film;
(c2) a leg portion extending from the cover plate portion in a direction to the filter supporting member; and
(c3) a fitting portion integrally formed with the leg portion and fitted to the fitting portion of the filter supporting member.

The water-proof sealing member is formed in an annular shape.

In the above electronic control device, the filter supporting member is inserted into the trough-hole from the inside space of the housing, the filter cover member is assembled to the filter supporting member from the outside of the housing, a pushing portion is formed either in the filter cover member or in the filter supporting member, the pushing portion is supported by the outer peripheral surface of the cylindrical portion, the water-proof sealing member surrounds the outer peripheral surface of the cylindrical portion and is interposed between an inner wall surface of the housing and the flanged portion.

According to the above features of the present disclosure, the cylindrical portion of the filter supporting member is inserted into the through-hole of the housing from the inside of the housing and the water-shedding film is attached to the upper-side axial end of the cylindrical portion so as to close the air passage formed in the cylindrical portion. According to the above structure, the air can flow into or flow out from the housing through the air passage, while it is possible to prevent the water from flowing into the air passage.

The filter cover member is assembled to the filter supporting member from the outside of the housing. The pushing portion, which is formed either in the filter supporting member or in the filter covering member, is supported by the outer peripheral surface of the cylindrical portion. The water-proof sealing member is interposed between the inner wall surface of the housing and the flanged portion of the filter supporting member, while the water-proof sealing member surrounds the cylindrical portion of the filter supporting member.

According to the above structure, a sealing structure (which is composed of the water-proof sealing member, the inner wall surface of the housing, the flanged portion of the filter supporting member, and so on) is arranged inside of the housing so as to stably hold the sealing structure. Therefore, even when the strong external force (for example, the high-pressure water) is applied to the air breathing filter from the outside of the housing, an influence by the external force is hardly transmitted to the sealing structure provided in the back side of the housing. It is, therefore, possible to surely prevent a situation that the water-proof sealing member and/or its related portions of the housing or the air breathing filter may be largely displaced or deformed. As a result, it is possible to surely prevent the water from entering the housing via the gap formed around the water-proof sealing member, even when the electronic control device is used in the circumstance in which the external force is easily applied to the air breathing filter.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
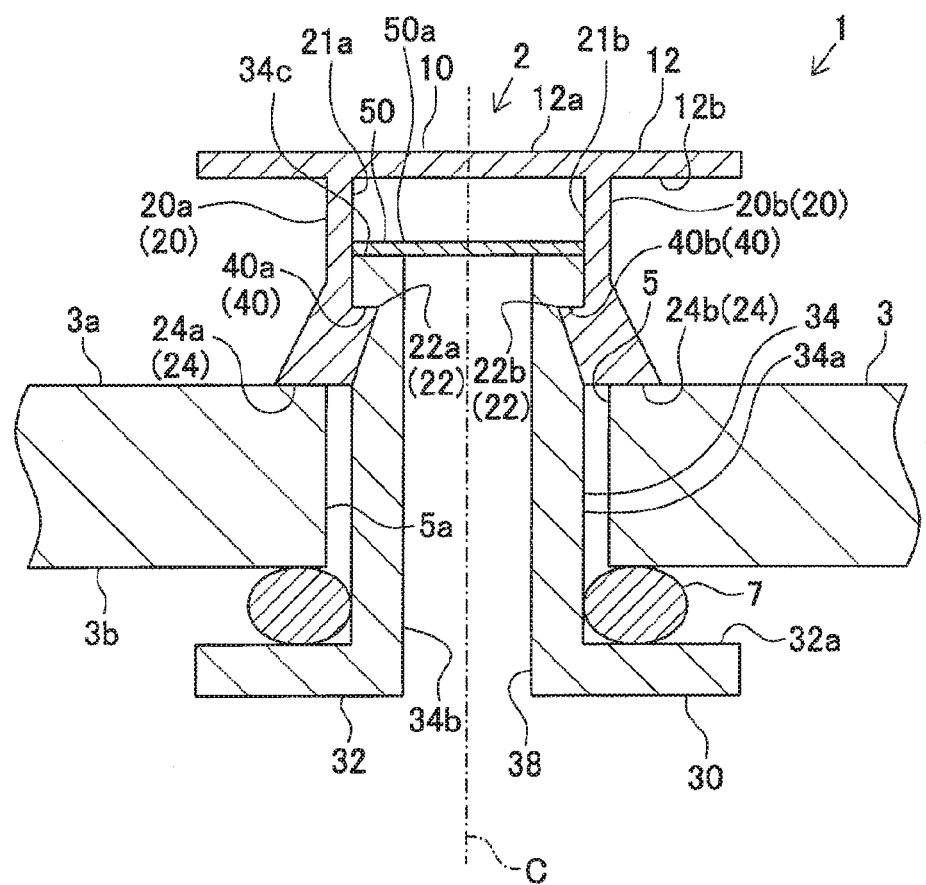
FIG. 1 is a schematic cross sectional view showing a structure of a relevant portion of an electronic control device according to a first embodiment of the present disclosure.

The present disclosure will be explained hereinafter by way of multiple embodiments and/or modifications with reference to the drawings. The same reference numerals are given to the same or similar structure and/or portion throughout the multiple embodiments and/or modifications.

First Embodiment

An electronic control device 1 of a first embodiment will be explained with reference to FIGS. 1 to 4.

For example, the electronic control device 1 is formed as an electronic control device for a vehicle, such as, an engine control unit (hereinafter, the engine ECU). The electronic control device 1 has a box-shaped housing 3 (hereinafter, the housing 3) for accommodating an electronic circuit board (not shown) and so on. FIG. 1 schematically shows a cross sectional view taken along a line I-I in FIG. 3.

The electronic circuit board accommodated in the housing 3 is composed of a laminated substrate, to which a microcomputer, resistors, transistors and other various kinds of electronic parts and/or components (such as ICs) are mounted. The laminated substrate is formed as a multi-layered circuit board, which is manufactured by a well-known method. A connector (not shown) is provided at one end of the electronic circuit board so that the electronic circuit board is electrically connected to outside electric devices. In FIGS. 1 to 4, only a relevant portion of the electronic control device 1 (a portion neighboring to an air breathing filter 2) is schematically shown, so that the circuit board, the connector and so on which are accommodated in the housing 3 are omitted from the drawings.

The housing 3 is made of metal, such as an aluminum die-casting product. Although not shown in the drawings, the housing 3 is composed of a first housing member and a second housing member. The first housing member (a main housing member) is formed in a box shape having an open end, while the second housing member (a cover member) is formed in a flat plate shape for closing the open end of the first housing member. An open portion is formed in the housing 3 in order that a part of the connector is outwardly projected from the housing 3 trough the open portion, wherein the connector is fitted into the open portion of the housing 3. In addition, sealing members are respectively provided at several portions, such as, a portion at which the first housing member (the main housing member) is in contact with the second housing (the cover member), a portion at which the connector is in contact with the first housing member, a portion at which the connector is in contact with the second housing member, and so on. According to a water-proof structure of the housing 3 as above, it is possible to prevent water from entering an inside of the housing 3 via a gap between the first and the second housing members or via a gap between the connector and the first or the second housing member. The above structure of the housing 3 is just an example. Any other various kinds of structures may be used as the water-proof structure for the electronic control device used in the vehicle.

A through-hole 5 is formed at a predetermined portion of the housing 3. The through-hole 5 passes through a wall portion of the housing 3, so that an inside space of the housing 3 is communicated to an outside of the housing 3. A location of the through-hole 5 is not limited to a specific portion of the housing 3. The through-hole 5 may be formed in the first housing member (the main housing member) or in the second housing member (the cover member). In the present embodiment, the air breathing filter 2 is attached to the through-hole 5 formed in the second housing member (the cover member).

The air breathing filter 2 is a filter unit having an air-ventilation function and a water-proof function. The air breathing filter 2 is composed of a filter supporting member 30, a filter cover member 10, a water-shedding film 50, a water-proof sealing member 7 and so on.

Figure 2:
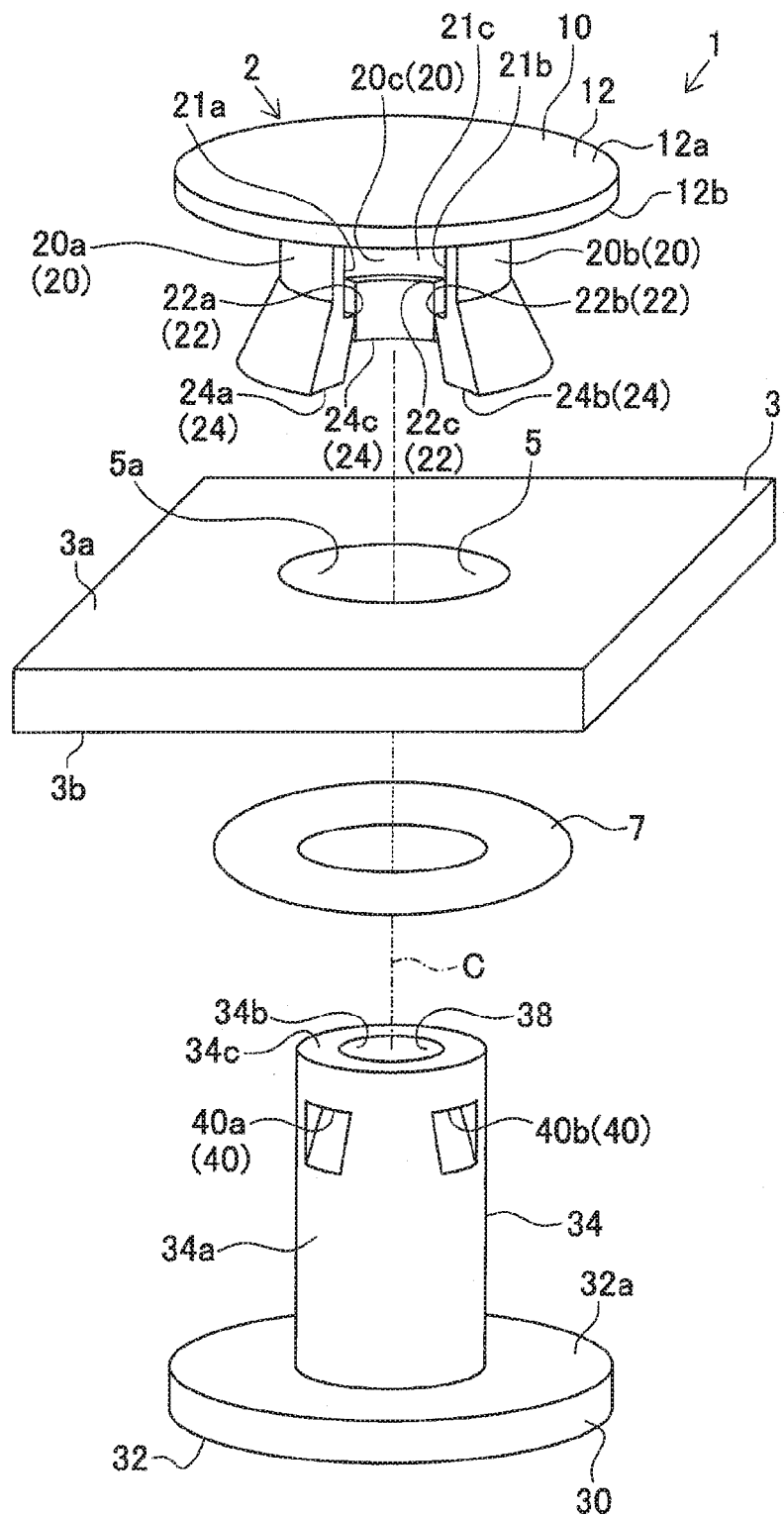
FIG. 2 is a schematically exploded perspective view showing the relevant portion of the electronic control device of FIG. 1.

As shown in FIGS. 1 and 2, the filter supporting member 30 is composed of a cylindrical portion 34, filter-body-side fitting portions 40 and a flanged portion 32. The cylindrical portion 34 is formed in a cylindrical shape and has an air passage 38 formed inside of the cylindrical portion 34 for communicating the inside space of the housing 3 to the outside of the housing 3. The filter-body-side fitting portions 40 have multiple (three) recessed portions 40*a*, 40*b* and 40*c* formed at an outer peripheral surface 34*a* of the cylindrical portion 34. The recessed portions 40*a*, 40*b* and 40*c* are arranged at equal intervals in a circumferential direction of the cylindrical portion 34. The outer peripheral surface 34*a*, except for the recessed portions 40*a* to 40*c*, is formed in a cylindrical surface having a center axis C of the cylindrical portion 34 as a cylindrical shaft. An inner peripheral surface 34*b* of the cylindrical portion 34 is also formed in a cylindrical surface, which has the center axis C as the cylindrical shaft. The air passage 38 is, therefore, formed in a cylindrical shape having the cylindrical inner peripheral surface 34*b* and extending in an axial direction of the air breathing filter 2 from an upper side to a lower side in FIG. 1.

Figure 3:
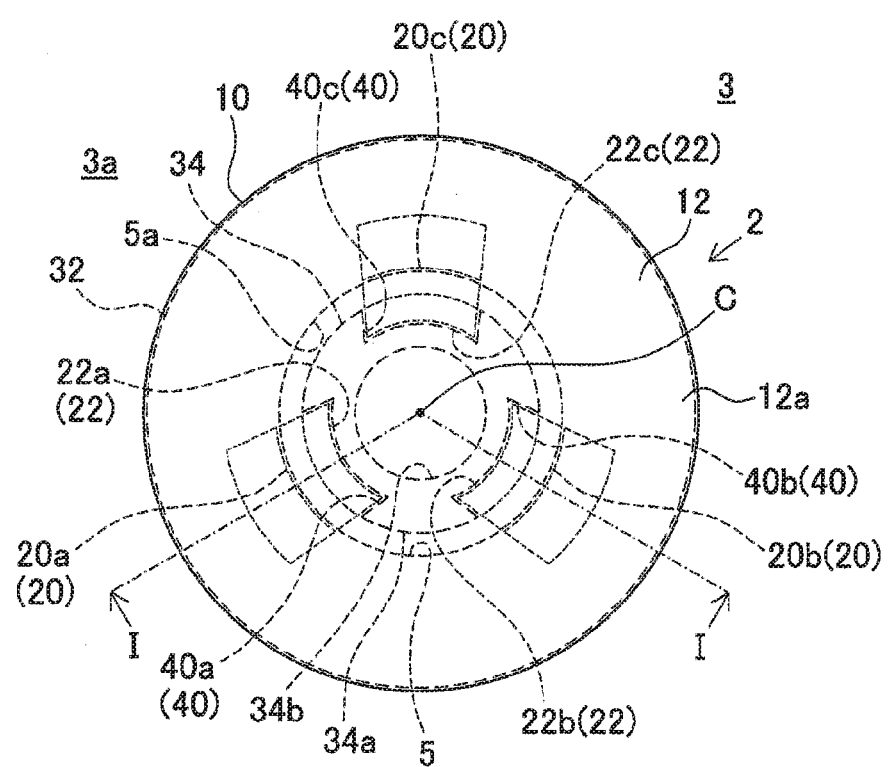
FIG. 3 is a schematic top plane view showing a portion neighboring to an air breathing filter of the electronic control device of FIG. 1.

As shown in FIGS. 2 and 3, each of the filter-body-side fitting portions 40, which are formed at the outer peripheral surface 34*a* on an upper side of the cylindrical portion 34, is engaged with a cover-side fitting portion 22 of the filter cover member 10, as explained below. The filter-body-side fitting portions 40 are composed of three recessed portions 40*a*, 40*b* and 40*c*, each of which is recessed in a radial-inward direction of the cylindrical portion 34 toward the center axis C. Each of the recessed portions 40*a* to 40*c* is formed at a position having a predetermined height in the axial direction from an upper-side surface 32*a* of the flanged portion 32. In each of the recessed portions 40*a* to 40*c*, an upper-end fitting surface is formed in a flat surface extending in a horizontal direction, so that the upper-end fitting surface of the recessed portion 40*a*/40*b*/40*c* faces in a downward direction.

In an assembled condition of the air breathing filter 2 to the housing 3, as shown in FIG. 1, the upper-end fitting surface of each recessed portion 40*a*/40*b*/40*c* faces in the axial direction to an upper-end fitting surface of each click portion 22*a*/22*b*/22*c* of the cover-side fitting portion 22 of the filter cover member 10. Each of the recessed portions 40*a* to 40*c* has a recess structure, a depth of which from the outer peripheral surface 34*a* becomes larger in an upward direction. In the present embodiment, a thickness direction of a wall portion of the cylindrical portion 34 is a depth direction of the recess structure for the recessed portions 40*a* to 40*c*. Therefore, a bottom surface of each recessed portion 40*a*/40*b*/40*c* is formed by a tapered surface inclined in a radial-inward direction of the cylindrical portion 34, so that the bottom surface comes closer to the center axis C in the upward direction As shown in FIG. 2, the flanged portion 32 extends in a radial-outward direction of the cylindrical portion 34 from the outer peripheral surface 34*a* of a lower end of the cylindrical portion 34. The flanged portion 32, which is connected to the outer peripheral surface 34*a* of the lower end of the cylindrical portion 34, is formed in an annular shape on a plane perpendicular to the center axis C. In other words, the flanged portion 32 is formed in a disc shape having a thickness in the axial direction of the cylindrical portion 34. The upper-side surface 32*a* of the flanged portion 32 is formed by a flat surface.

In the above structure, the axial direction (the direction of the center axis C) of the cylindrical portion 34, that is, a direction of the air passage 38 corresponds to a vertical direction. In FIG. 1, an up-and-down direction is the vertical direction. Therefore, the direction perpendicular to the direction of the center axis C is the horizontal direction. A surface direction of the upper-side surface 32*a* of the flanged portion 32 corresponds to the horizontal direction.

As shown in FIG. 1, the water-shedding film 50 is provided at an upper end 34*c* of the cylindrical portion 34 of the filter supporting member 30. More exactly, the water-shedding film 50 is located at the upper end 34*c* of the cylindrical portion 34 so as to close the air passage 38. In the present embodiment, as shown in FIG. 1, the water-shedding film 50 is attached to the upper end 34*c* of the cylindrical portion 34 in such a way so as to close an open end (an upper-side open end of the air passage 38) formed at the upper end 34*c* of the cylindrical portion 34. The water-shedding film 50 is made of a well-known water-shedding film, through which air is allowed to pass but water cannot pass. For example, the water shedding film 50 is made of a water-repellent textile, which is formed as a sheet member having an air ventilation characteristic and a water-proof property. The water-shedding film 50 is omitted in FIG. 2.

As shown in FIG. 1, the water-proof sealing member 7 is so arranged as to surround the cylindrical portion 34 of the filter supporting member 30. As shown in FIG. 2, the water-proof sealing member 7 is made of a well-known limp material and formed in an annular shape as an O-ring. In the assembled condition, as shown in FIG. 1, the water-proof sealing member 7 is located at the outer peripheral surface 34*a* of the cylindrical portion 34 so as to surround the cylindrical portion 34. The water-proof sealing member 7 is interposed between the flanged portion 32 of the filter supporting member 30 and an inner wall surface 3*b* of the housing 3.

As shown in FIGS. 1 and 2, the filter cover member 10 has a cover plate portion 12, multiple leg portions 20 (three leg portions 20*a*, 20*b* and 20*c*) and the click portions 22*a* to 22*c*, each of which is formed as the cover-side fitting portion 22. The cover plate portion 12 is a disc-shape plate arranged at a position above the water-shedding film 50. As shown in FIG. 1, a thickness direction of the cover plate portion 12 coincides with the up-and-down direction. Each of an upper-side surface 12*a* and a lower-side surface 12*b* of the cover plate portion 12 is formed by a flat surface, so that each surface direction of the upper-side and the lower-side surfaces 12*a* and 12*b* extends in the horizontal direction. An outer periphery of the cover plate portion 12 is formed in a circular shape. The cover plate portion 12 has a horizontal dimension, which is sufficiently large to cover the water-shedding film 50, which is located below the cover plate portion 12. According to the above structure, in which the cover plate portion 12 is arranged above the water-shedding film 50, it is possible to prevent water from directly hitting against the water-shedding film 50 from an upper side of the water-shedding film 50.

As shown in FIG. 2, the multiple leg portions 20 are connected to the cover plate portion 12. More exactly, each of three leg portions 20a, 20b and 20c has the cover-side fitting portion 22 (the click portions 22a to 22c), wherein each of the leg portions 20a to 20c extends in an axial-downward direction of the filter cover member 10 from the lower-side surface 12b of the plate portion 12. In the assembled condition, a lower-side leg portion 24 (a forward end portion) of each leg portion 20a/20b/20c is in contact with the outer peripheral surface 34a of the cylindrical portion 34.

As shown in FIGS. 1 and 2, each of the leg portions 20a to 20c has an upper-side leg portion 21a/21b/21c (a straightly extending portion), which extends in the axial-downward direction from the lower-side surface 12b of the cover plate portion 12. Each of the upper-side leg portions 21a to 21c is formed in a plate shape having a thickness direction in the radial direction of the cylindrical portion 34. A plate surface of each upper-side leg portion 21a/21b/21c extends in the up-and-down direction in the drawings. The plate surface of each upper-side leg portion 21a/21b/21c is so arranged as to be opposed to the outer peripheral surface 34a of the cylindrical portion 34 in the radial direction, so that the plate surface is in contact with the outer peripheral surface 34a or located at a position close to the outer peripheral surface 34a. According to the above structure, a relative movement of the filter cover member 10 to the filter supporting member 30 in the radial direction, in other words, the relative movement in the horizontal direction is restricted. An upper-end portion of the cylindrical portion 34 is arranged in an area surrounded by the upper-side leg portions 21a to 21c of the filter cover member 10.

As shown in FIG. 2, each of the lower-side leg portions 24 having the cover-side fitting portion 22 is integrally formed with each of the upper-side leg portions 21a to 21c. More exactly, the click portion 22a is integrally formed with the leg portion 20a, the click portion 22b is integrally formed with the leg portion 20b, and the click portion 22c is integrally formed with the leg portion 20c. Each of the click portions 22a to 22c of the cover-side fitting portions 22 is fitted into the respective recessed portion 40a/40b/40c of the filter-body-side fitting portion 40 formed at the outer peripheral surface 34a of the cylindrical portion 34. Each of the click portions 22a to 22c is formed in a projection shape projecting in the radial-inward direction of the cylindrical portion 34 (in the direction to the center axis C).

For example, the click portion 22a is projected in the radial-inward direction from an inner peripheral surface of the upper-side leg portion 21a and has the upper-end fitting surface extending in the horizontal direction. In the assembled condition shown in FIG. 1, the click portion 22a is inserted into the recessed portion 40a, so that the upper-end fitting surface of the click portion 22a and the upper-end fitting surface of the recessed portion 40a are opposed to each other in the axial direction (in the vertical direction). According to the above structure, a movement of the click portion 22a in the upward direction is restricted. Each of the click portions 22b and 22c has the same structure to that of the click portion 22a. As above, the filter cover member 10 is assembled and fixed to the filter supporting member 30.

The structure of the air breathing filter 2 will be further explained.

When the air breathing filter 2 is assembled to the housing 3, the cylindrical portion 34 of the filter supporting member 30 is inserted into the through-hole 5 of the housing 3 from the inside of the housing 3. More exactly, the upper-end portion of the cylindrical portion 34 is outwardly projected from an upper-side surface 3a (the outer wall surface 3a) of the housing 3, so that each of the filter-body-side fitting portions 40 (the respective recessed portions 40a to 40c) is located at such a position above an upper-side end of the through-hole 5. Then, the filter cover member 10 is assembled to the filter supporting member 30 from the outside of the housing 3. More exactly, each of the click portions 22a to 22c of the leg portions 20a to 20c is fitted into the respective recessed portions 40a to 40c so as to fix the filter cover member 10 to the filter supporting member 30. Each of the leg portions 20a to 20c is elastically deformable, so that each of the cover-side fitting portions 22 formed at each lower-side leg portion 24a/24b/24c is outwardly expandable. In the assembled condition, as shown in FIG. 1, each of the leg portions 20a to 20c is in contact with the outer peripheral surface 34a of the cylindrical portion 34 or held at the position close to the outer peripheral surface 34a.

In the assembled condition, as shown in FIG. 1, the lower-side leg portion 24 of each leg portion 20a/20b/20c is in contact with and supported by the upper-side surface 3a of the housing 3, so that the lower-side leg portion 24 pushes the upper-side surface 3a of the housing 3 from the outside in the downward direction. A forward end portion of each leg portion 20a/20b/20c, that is, each lower-side leg portion 24a/24b/24c is also referred to as a pushing portion. In the assembled condition, since the lower-side leg portions 24 (the pushing portions 24a to 24c) of the filter cover member 10 are in contact with and supported by the upper-side surface 3a of the housing 3, the relative movement of the filter cover member 10 in the downward direction is restricted. In addition, since the upper-end fitting surfaces of the cover-side fitting portions 22 (the click portions 22a to 22c) are pushed by the upper-end fitting surfaces of the respective recessed portions 40a to 40c in the downward direction, the relative movement of the filter cover member 10 in the upward direction is also restricted.

In the assembled condition, the wall portion of the housing 3 and the water-proof sealing member 7 are interposed between the lower-side leg portions 24 (the pushing portions 24a to 24c) located at the outside of the housing 3 and the flanged portion 32 located at the inside of the housing 3. More exactly, the water-proof sealing member 7 is interposed between the inner wall surface 3b of the housing 3 and the upper-side surface 32a of the flanged portion 32. As shown in FIG. 1, the water-proof sealing member 7 is held in a compressed condition. In such a compressed condition of the water-proof sealing member 7, an upper-side portion of the water-proof sealing member 7 is tightly in contact with the inner wall surface 3b of the housing 3, while a lower-side portion of the water-proof sealing member 7 is tightly in contact with the upper-side surface 32a of the flanged portion 32. In addition, an inner-peripheral side portion of the water-proof sealing member 7 is tightly in contact with the outer peripheral surface 34a of the cylindrical portion 34. According to the above structure (the tight contacts at three portions), a gap between the housing 3 and the filter supporting member 30 is tightly sealed.

In the assembled condition, since the lower-side portion of the water-proof sealing member 7 is tightly in contact with the flanged portion 32, a pushing force is always applied by the water-proof sealing member 7 to the flanged portion 32 in the downward direction. In other words, a biasing force is always applied to the filter supporting member 30 for biasing the filter supporting member 30 in the downward direction. The filter cover member 10 receives the biasing force at the upper-end fitting surfaces of the click portions 22a to 22c. Therefore, the biasing force is also applied to the filter cover member 10 for biasing it in the downward direction. As a result, the lower-side leg portions 24 (the pushing portions 24a to 24c) are pushed to the upper-side surface 3a of the housing 3.

Air pressure in the inside space formed in the housing 3 becomes substantially equal to air pressure at the outside of the housing 3 (that is, the atmospheric pressure) because of the air breathing filter 2 assembled to the housing 3 as above. In a case that the electronic control device 1 is applied to the engine ECU of the vehicle, a pressure sensor is often provided on the circuit board accommodated in the housing 3. Even in the case that the pressure sensor is provided inside of the housing 3, the pressure sensor can accurately detect the air pressure outside of the housing 3, because the inside pressure of the housing 3 becomes substantially equal to the outside pressure due to the air breathing filter 2.

In the present embodiment, as explained above, the filter supporting member 30 is attached to the housing 3 in such a way that the cylindrical portion 34 of the filter supporting member 30 is inserted into the through-hole 5 of the housing 3 from the inside of the housing 3. The water-shedding film 50 is attached to the upper end 34c of the cylindrical portion 34 of the filter supporting member 30 in the condition that the water-shedding film 50 closes the air passage 38 formed in the cylindrical portion 34. According to the above structure, it is possible to allow the air to enter or exit on one hand, while it is possible to prevent the water from entering the air passage 38 from the outside of the housing 3.

In addition, the filter cover member 10 is assembled to the filter supporting member 30, wherein the filter cover member 10 is located at the position outside of the housing 3 while the filter supporting member 30 is inserted into the through-hole 5 from the inside of the housing 3. In the assembled condition, the pushing portions 24a to 24c (which are portions of the filter cover member 10) push the outer wall surface 3a of the housing 3 and the water-proof sealing member 7 is interposed between the inner wall surface 3b of the housing 3 and the flanged portion 32 of the filter supporting member 30.

A sealing structure, which is composed of the water-proof sealing member 7 and its related portions which include the inner wall surface 3b of the housing 3 and the flanged portion 32, is arranged inside of the housing 3. Therefore, even when a strong external force (for example, high pressure water) is applied from the outside of the housing 3 to a portion of the housing 3 (for example, a portion neighboring to the air breathing filter 2), such external force cannot be directly applied to the sealing structure, which is arranged inside of the housing 3 and located at a back side of the housing 3. It is, therefore, possible to surely prevent the water-proof sealing member 7 and its related portions from being largely deformed by the external force. Accordingly, even when the electronic control device 1 is located at the position, in which the external force is likely to be applied to the portion of the housing 3 neighboring to the air breathing filter 2 (for example, in a circumstance in which cleaning water of a high-pressure washing machine may be applied to the electronic control device), it is possible to surely prevent leakage of water around the water-proof sealing member 7. Namely, the electronic control device 1 can sufficiently bring out its water-proof function even in the above circumstance.

In recent years, the high-pressure washing machine having a large output has particularly become popular. Therefore, a demand for water-proof property, for example, a structure sustainable against the high-pressure water, is increased for such electronic parts and/or component mounted in an engine room of the vehicle. The electronic control device 1 of the present embodiment has a structure, which can sufficiently satisfy such demand. When the electronic control device of the present disclosure is applied to the engine ECU, it is more advantageous. The electronic control device of the present disclosure may be applied to any other ECU, which is located at a position other than the engine room.

Figure 8:
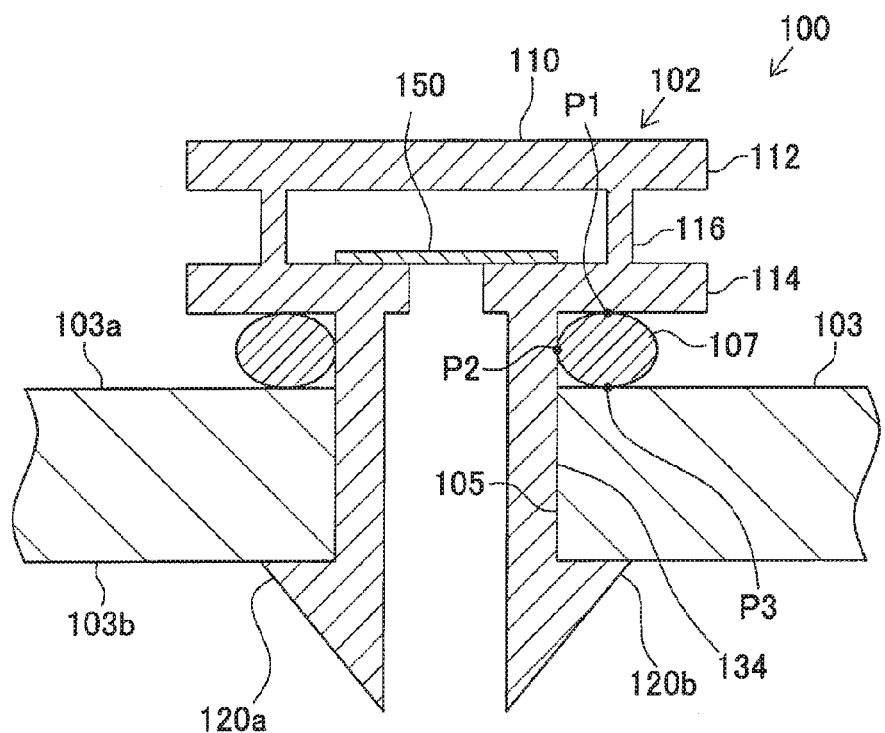
FIG. 8 is a schematic cross sectional view showing a structure of a relevant portion of an electronic control device according to a comparison example.
Figure 9:
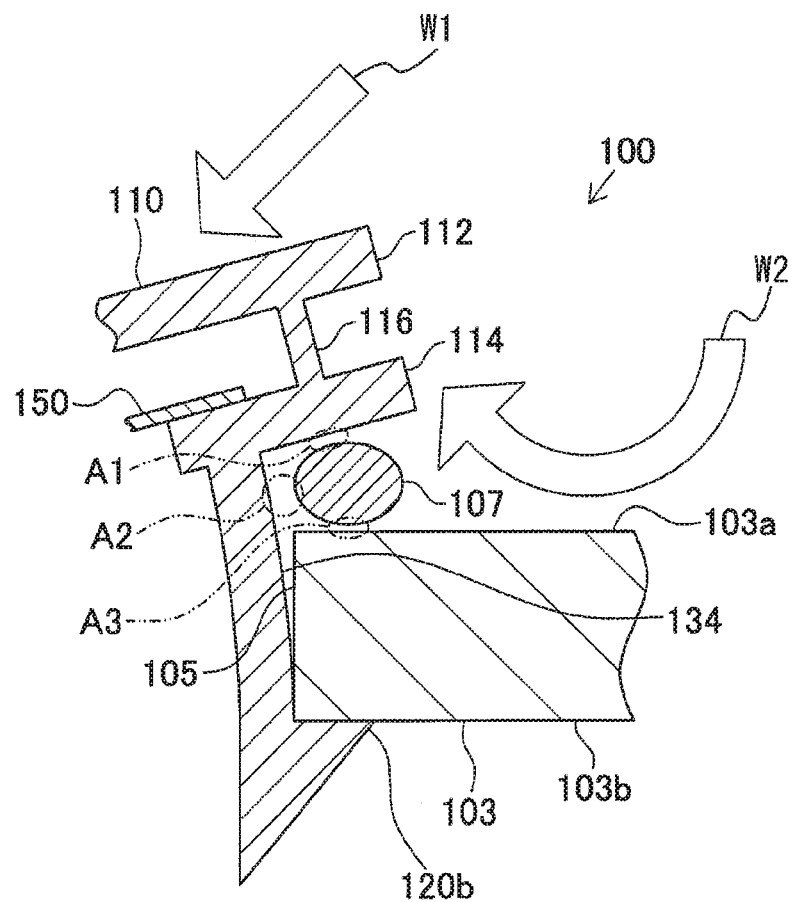
FIG. 9 is a schematic view for explaining a deformation of an air breathing filter when an external force is applied to a portion of the air breathing filter or a portion of a housing neighboring to the air breathing filter.

Advantages of the present disclosure will be further explained by comparing the present embodiment with a comparison example shown in FIGS. 8 and 9.

An electronic control device 100 of FIG. 8 has a housing 103, which is the same to the housing 3 of the first embodiment. An air breathing filter 102 is attached to a through-hole 105 of the housing 103. The air breathing filter 102 is composed of a cylindrical portion 134 inserted into the through-hole 105, a flanged portion 114 outwardly extending from an upper-side portion of the cylindrical portion 134 in a radial direction, a cover plate portion 112 formed above the flanged portion 114 and covering a water-shedding film 150, and connecting portions 116 for connecting the cover plate portion 112 to the flanged portion 114. The cylindrical portion 134, the flanged portion 114, the cover plate portion 112 and the connecting portions 116 are integrally formed as one unit of a filter main body 110. The water-shedding film 150 is provided in the filter main body 110 so as to close an air passage formed in the cylindrical portion 134. An O-ring 107 is provided at a position of the upper-side portion of the cylindrical portion 134 between the flanged portion 114 and an upper-side surface 103a (an outer wall surface) of the housing 103. Click portions 120a and 120b are formed at a lower-side portion of the cylindrical portion 134, so that each of the click portions 120a and 120b is engaged with a lower-side surface 103b (an inner wall surface) of the housing 103.

According to the above structure, the filter main body 110 is assembled to the housing 103 by inserting the cylindrical portion 134 into the through-hole 105 from the outside of the housing 103 and by engaging the click portions 120a and 120b with the inner wall surface 103b of the housing 103 at a lower end of the through-hole 105. In an assembled condition, as shown in FIG. 8, the O-ring 107 is held between the flanged portion 114 and the outer wall surface 103a of the housing 103 in a compressed condition. In a normal condition (in the assembled condition of FIG. 8), the O-ring 107 is tightly in contact with the flanged portion 114, the cylindrical portion 134 and the outer wall surface 103a of the housing 103 at respective contacting points P1, P2 and P3. Accordingly, it is possible to prevent water from entering a gap between the cylindrical portion 134 and the through-hole 105 of the housing 103 from the outside of the housing 103.

However, when the high-pressure water of the high-pressure cleaning machine hits against the flanged portion 114 or the cover plate portion 112, the flanged portion 114 or the cover plate portion 112 may be deformed, for example, as shown in FIG. 9. In such a case, the O-ring 107 may become out of the tight contact with the corresponding contacting points P1, P2 and/or P3. In FIG. 9, a white arrow W1 shows a direction of the high-pressure water directly hitting against the cover plate portion 112, while a white arrow W2 shows a direction of the high-pressure water which is rebound from the upper-side surface 103a of the housing 103 and pushes up the flanged portion 114. Therefore, FIG. 9 shows a condition in which the filter main body 110 is deformed and/or displaced at a portion close to the flanged portion 114 or the cylindrical portion 134. When any gap A1/A2/A3 is generated between the O-ring 107 and the flanged portion 114, between the O-ring 107 and the cylindrical portion 134, and/or between the O-ring 107 and the housing 103, as shown in FIG. 9, the high-pressure water may enter the housing 103 through such gap A1/A2/A3.

When compared the present embodiment (FIGS. 1 to 3) with the comparison example (FIGS. 8 and 9), the sealing structure of the present embodiment (the water-proof sealing member 7, the flanged portion 32 and the inner wall surface 3b of the housing 3) is provided in the inside of the housing 3. Therefore, even when the high-pressure water hits against the portion of the air breathing filter 2, which is located at the outside of the housing 3, and such portion is slightly deformed or displaced, an influence to the portion of the filter supporting member 30 close to the water-proof sealing member 7 is small. As a result, a high sealing performance by the water-proof sealing member 7 can be maintained. In addition, in a case that the high-pressure water is rebound from the outer wall surface 3a of the housing 3 and such rebound water pushes up the cover plate portion 12 of the filter cover member 10, a direction of pushing up the filter cover member 10 is a direction for increasing the tight contact of the water-proof sealing member 7. It is, therefore, possible to surely prevent a decrease of the water-proof property.

In a prior art of Japanese Patent Publication No. 2011-165748, a technology for a counter-measure against the high-pressure water is disclosed. According to the prior art, an air breathing filter is provided in a recessed portion formed at an outer wall surface of a housing and an air ventilation groove is formed on the outer wall surface so as to be communicated to the recessed portion. A shielding plate is provided in order to close the recessed portion. According to the above structure, an external force is prevented by the shielding plate from being directly applied to an inside part (that is, the air breathing filter) of the recessed portion, while air entrance and exit between the recessed portion and the outside of the housing is allowed through the air ventilation groove.

According to the above structure of the prior art, however, it is necessary to separately provide the shielding plate. Therefore, it is not possible to avoid an increase of a number of parts and components, a complicated process for assembling steps, an increase of manufacturing cost or the like.

However, according to the present embodiment, as shown in FIGS. 1 to 3, it is not necessary to provide the shielding plate but possible to ensure a sufficient water-proof property without such shielding plate. It is, therefore, possible to overcome the above explained disadvantages and to prevent a size of the air breathing filter from becoming larger.

In addition, according to the present embodiment shown in FIGS. 1 to 3, the multiple filter-body-side fitting portions 40 formed in the filter supporting member 30 are formed by the recessed portions 40a to 40c, each of which is recessed from the outer peripheral surface 34a of the cylindrical portion 34 in the radial-inward direction. In other words, none of the fitting portions 40 is projected from the outer peripheral surface 34a in the radial-outward direction. In the assembled condition, as shown in FIG. 1, in which the filter cover member 10 is fixed to the filter supporting member 30, each of the lower-side leg portions 24 (the pushing portions 24a to 24c) of the filter cover member 10 pushes the housing 3 from the outside thereof and the water-proof sealing member 7 and the housing 3 are interposed between the lower-side leg portions 24 (the pushing portions 24a to 24c) and the flanged portion 32.

As above, since each of the filter-body-side fitting portions 40 of the present embodiment has not a projection structure but the recess structure, the filter-body-side fitting portions 40 (the recessed portions 40a to 40c) do not lie in the way when the cylindrical portion 34 is inserted into the through-hole 5 from the inside of the housing 3. In other words, the cylindrical portion 34 can be smoothly inserted into the through-hole 5, even when an outer diameter of the cylindrical portion 34 and an inner diameter of the trough-hole 5 are close to each other. Therefore, it is possible to make the inner diameter of the through-hole 5 smaller so as to make a gap (a clearance) smaller between the outer peripheral surface 34a of the cylindrical portion 34 and an inner peripheral surface 5a of the through-hole 5. As a result, a water entering pathway is reduced to avoid a situation that a large amount of water is pushed into the gap (the clearance) by a strong force. It is, therefore, possible to surely prevent strong water pressure from being applied to the water-proof sealing member 7.

In the present embodiment, the cylindrical portion 34 is arranged in the vertical direction, so that one end of the cylindrical portion 34 to which the water-shedding film 50 is attached is located at the upper end 34c of the cylindrical portion 34, while the other end of the cylindrical portion 34 at which the flanged portion 32 is formed is located at the lower side. And the upper-end portion of the cylindrical portion 34 is outwardly projected from the upper-side surface 3a (the outer wall surface 3a) of the housing 3 in the upward direction in a filter fitting area directly below the cover plate portion 12 of the filter cover member 10. The filter fitting area is a portion of the outer wall surface 3a, which is located directly below the cover plate portion 12 and covered by the cover plate portion 12 when viewed it in the vertical direction, as shown in FIG. 3.

The water-shedding film 50 is located at a position above the filter fitting area of the outer wall surface 3a. In other words, the outer wall surface 3a of the housing 3 is formed at the position lower than the water-shedding film 50 in the filter fitting area below the cover plate portion 12. It is, therefore, possible to prevent the water attached to the outer wall surface 3a from flowing toward an upper-side surface 50a of the water-shedding film 50.

Figure 4A:
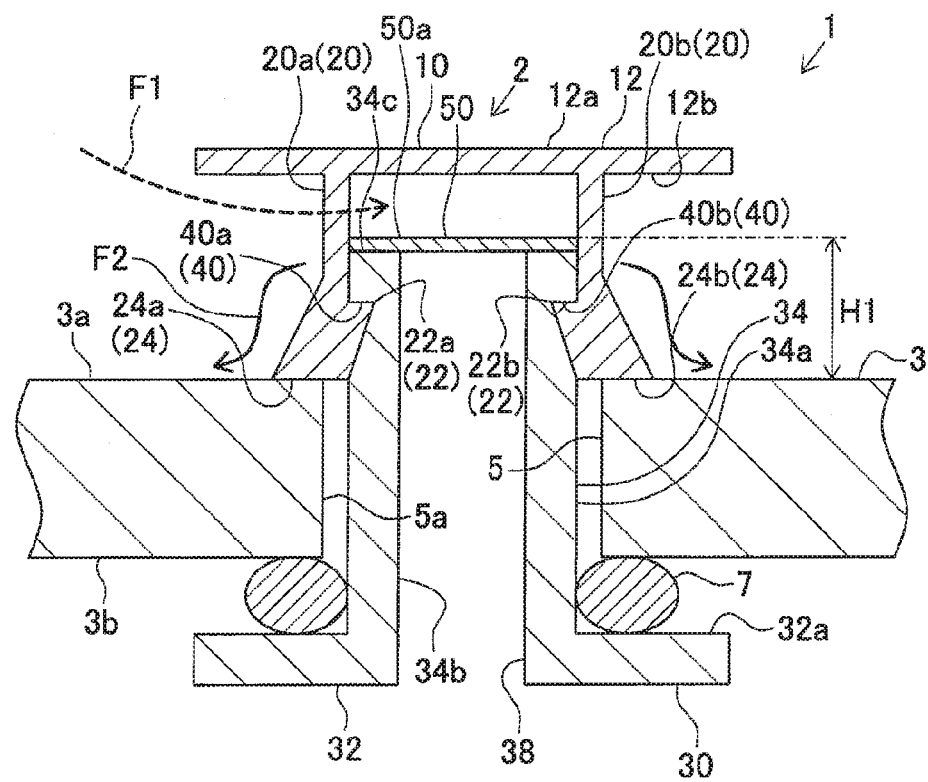
FIG. 4A is also a schematic cross sectional view showing the electronic control device of FIG. 1 for explaining a flow of water when the water is attached to the air breathing filter.

In addition, as shown in FIG. 4A, since the upper-side surface 50a of the water-shedding film 50 is located at the position higher than the outer wall surface 3a of the housing 3, the water can easily flow down from the water-shedding film 50 as indicated by an arrow F2 of a solid line even in a case that the water enters the air breathing filter 2 as indicated by an arrow F1 of a dotted line. It is, therefore, possible to suppress an accumulation of the water on the upper-side surface 50a of the water-shedding film 50, to thereby maintain and/or increase the air ventilation characteristic and the water-proof property.

Figure 4B:
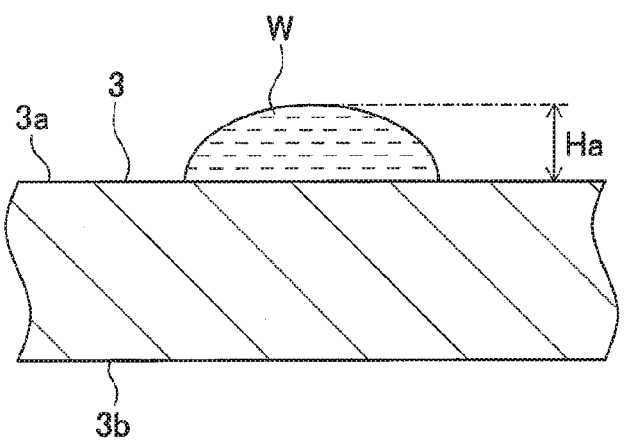
FIG. 4B is a schematic view for explaining a water drop attached to an outer wall surface of the electronic control device.

In addition, as shown in FIG. 4B, when the water is attached to the outer wall surface 3a of the housing 3, a water drop W having a height Ha may be held on the outer wall surface 3a because of a surface tension. It is, therefore, preferable that a height H1 between the upper-side surface 50a of the water-shedding film 50 and the outer wall surface 3a of the housing 3 is larger than the height Ha of the water drop W. According to the above feature (H1>Ha), the water attached to the outer wall surface 3a may hardly flow to the upper-side surface 50a of the water-shedding film 50. It is, therefore, possible to more surely suppress the accumulation of the water on the upper-side surface 50a of the water-shedding film 50.

Second Embodiment

A second embodiment of the present disclosure will be explained with reference to FIGS. 5 and 6.

An electronic control device 201 of the second embodiment is different from the first embodiment in a structure of an air breathing filter 202. The housing 3 of the second embodiment is the same to that of the first embodiment.

In the electronic control device 201, the air breathing filter 202 is attached to the housing 3 having the water-proof structure. The through-hole 5 (which is the same to that of the first embodiment) is formed in the housing 3, so that the inside of the housing 3 is communicated to the outside of the housing 3. The electronic circuit board, the connector and so on, which are accommodated in the housing 3, are the same to those of the first embodiment.

The air breathing filter 202 of the electronic control device 201, which is provided in order to bring out the air ventilation characteristic and the water-proof property for the housing 3, is composed of a filter supporting member 230, a filter cover member 210, the water-shedding film 50, and the water-proof sealing member 7.

The filter supporting member 230 is composed of a cylindrical portion 234, multiple filter-body-side fitting portions 240 and a flanged portion 232. The cylindrical portion 234 is formed in a cylindrical shape having an air passage 238 inside thereof. The filter-body-side fitting portions 240 are formed at an upper-end portion of the cylindrical portion 234. The flanged portion 232 is formed at a lower-end portion of the cylindrical portion 234 and extending from an outer peripheral surface 234a of the cylindrical portion 234 in the radial-outward direction. The filter supporting member 230 is inserted into the through-hole 5 of the housing 3 from the inside of the housing 3. Each of the filter-body-side fitting portions 240 has the same structure to that of the first embodiment. More exactly, the filter-body-side fitting portions 240 are composed of three recessed portions 240a to 240c, each of which is formed at the outer peripheral surface 234a of the cylindrical portion 234. In FIGS. 5 and 6, the recessed portions 240a and 240b are shown, while recessed portion 240c is not shown. The outer peripheral surface 234a of the cylindrical portion 234 (except for the recessed portions 240a to 240c) is formed in a cylindrical surface having the center axis C of the cylindrical portion 234 as the cylindrical shaft. An inner peripheral surface 234b of the cylindrical portion 234 is also formed in a cylindrical surface, which has the center axis C as the cylindrical shaft.

In the present embodiment, multiple arm portions 242 (three arm portions 242a to 242c) are formed in the filter supporting member 230 so as to extend from the outer peripheral surface 234a of the cylindrical portion 234 in the radial-outward direction and in the downward direction. In the drawings, two arm portions 234a and 234b are shown. Each of the arm portions 242a to 242c is formed at a position of the cylindrical portion 234, which is lower than the recessed portions 240a to 240c but higher than a middle portion of the cylindrical portion 234.

Figure 5:
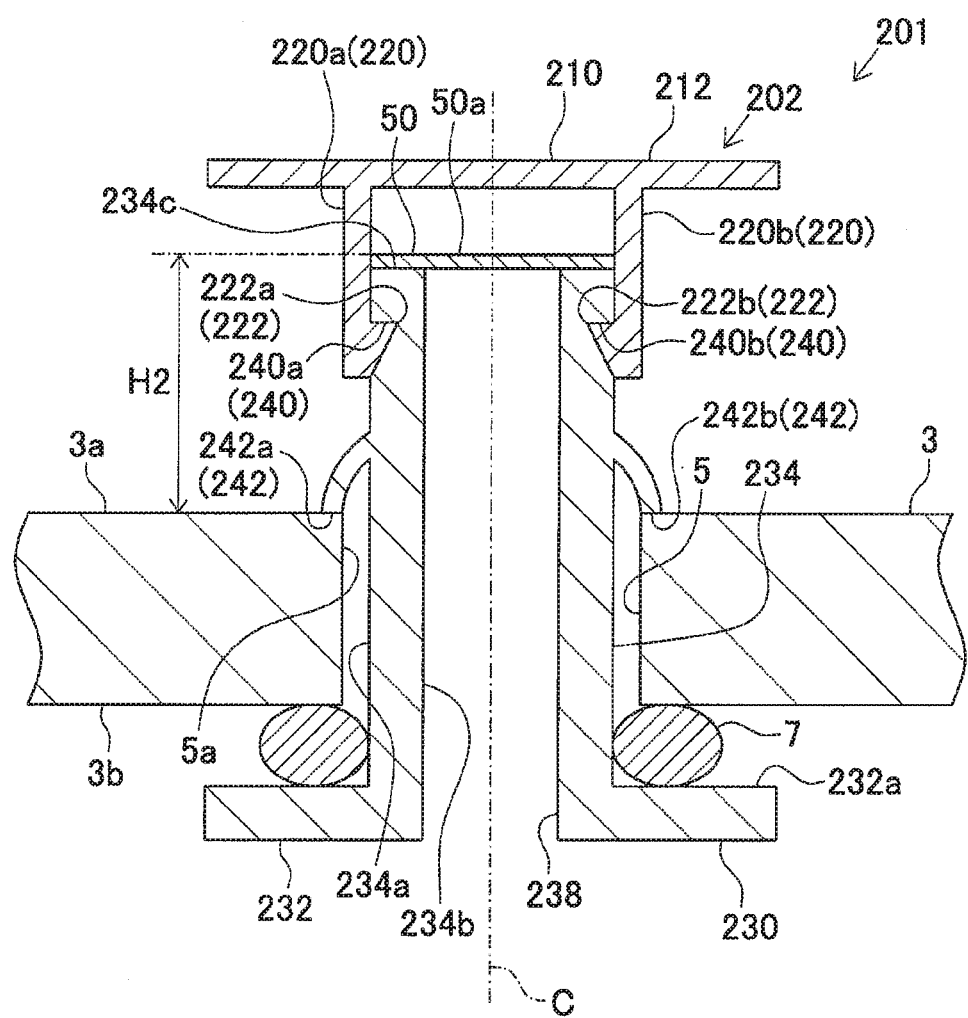
FIG. 5 is a schematic cross sectional view showing a structure of a relevant portion of an electronic control device according to a second embodiment of the present disclosure.
Figure 6:
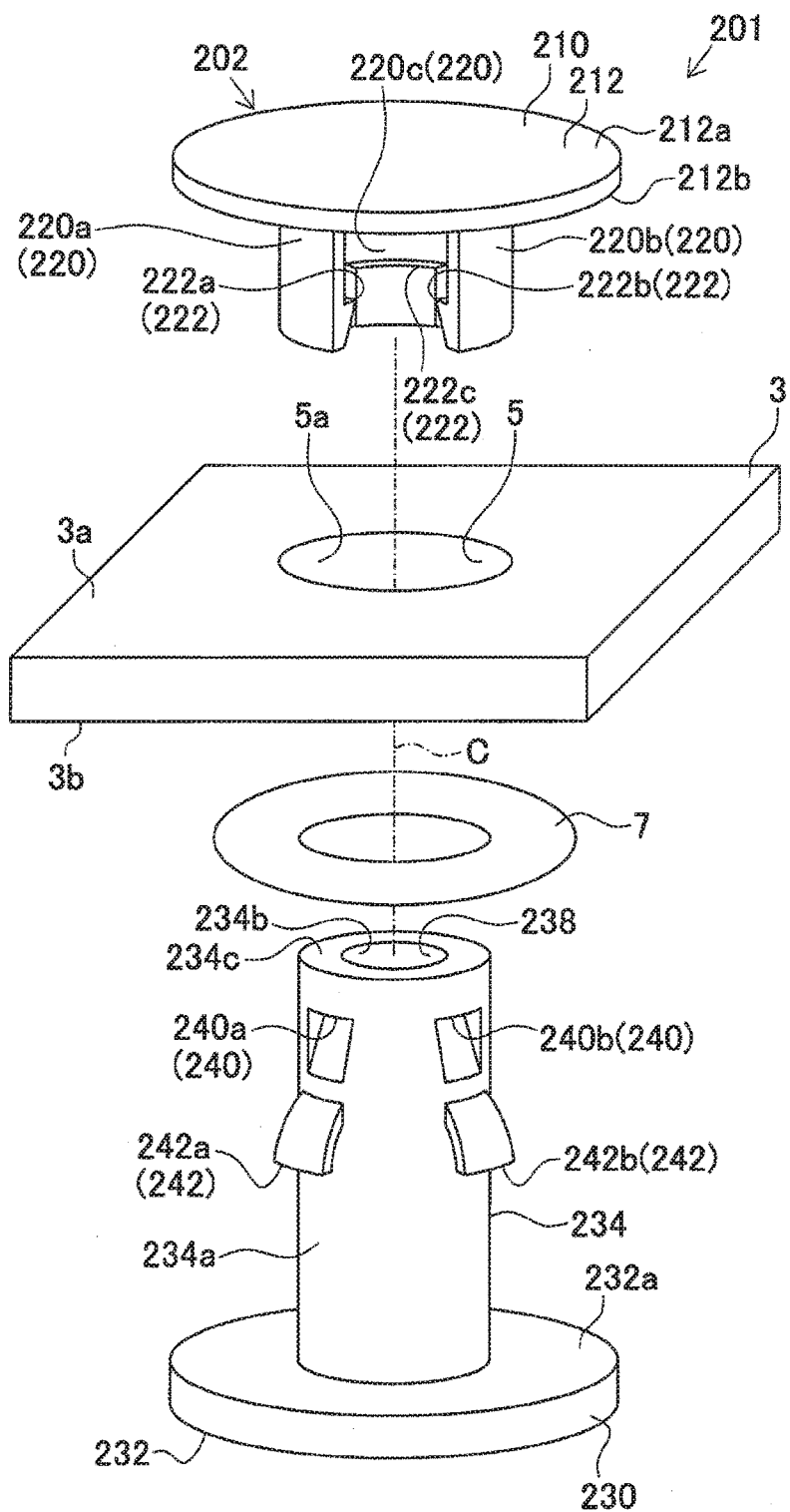
FIG. 6 is a schematically exploded perspective view showing the relevant portion of the electronic control device of FIG. 5.

In an assembled condition, as shown in FIG. 5, each of the arm portions 242a to 242c is located at a position above the upper-side end of the through-hole 5 (that is, the outside of the housing 3) and in contact with and supported by the outer wall surface 3a of the housing 3. Each of the arm portions 242a to 242c is elastically deformable and swingable. In a natural situation, in which no external force is applied to the filter supporting member 230, each of the arm portions 242a to 242c is expanded in the radial-outward direction to some extent. A forward end of each arm portion 242a to 242c is deformable in the radial-inward direction to the outer peripheral surface 234a, so that the cylindrical portion 234 of the filter supporting member 230 can be inserted through the through-hole 5 of the housing 3 when the arm portions 242a to 242c are elastically deformed in the direction to the outer peripheral surface 234a of the cylindrical portion 234.

In the present embodiment, the cylindrical portion 234 of the filter supporting member 230 (including the air passage 238) also extends in the vertical direction. The center axis C of the cylindrical portion 234 corresponds to the vertical direction. The water-shedding film 50 is provided at an upper end 234c of the cylindrical portion 234, while the flanged portion 232 is formed at the lower-end portion of the cylindrical portion 234. An upper-side surface 232a of the flanged portion 232 extends in the radial-outward direction perpendicular to the center axis C, that is, in the horizontal direction.

The water-shedding film 50, which is identical to that of the first embodiment, is attached to the upper end 234c of the cylindrical portion 234 so as to close the air passage 238. In the present embodiment, the upper-end portion of the cylindrical portion 234 is also outwardly projected from the upper-side surface 3a (the outer wall surface 3a) of the housing 3 in the upward direction in the filter fitting area directly below a cover plate portion 212 of the filter cover member 210. The water-shedding film 50 is located at a position above the filter fitting area of the outer wall surface 3a, which is formed below the cover plate portion 212.

The filter cover member 210 is composed of the cover plate portion 212 covering the water-shedding film 50, three leg portions 220 extending from the cover plate portion 212 and three cover-side fitting portions 222, each of which is integrally formed with the respective leg portion 220 (220a to 220c) and fitted into the filter-body-side fitting portions 240 (the respective recessed portions 240a to 240c). Each of the leg portions 220a to 220c extends from a lower-side surface 212b of the cover plate portion 212 of the filter cover member 210 in the downward direction. Each of the cover-side fitting portions 222 has the same structure to that of the cover-side fitting portion 22 of the first embodiment. More exactly, each of the cover-side fitting portions 222 has a click portion 222a/222b/222c, which is formed as a projection in the respective leg portion 220a/220b/220c.

The water-proof sealing member 7 is composed of the same O-ring to that of the first embodiment. In the assembled condition, as shown in FIG. 5, the water-proof sealing member 7 is arranged along the outer peripheral surface 234a so as to surround the cylindrical portion 234. The water-proof sealing member 7 is held in the compressed condition interposed between the flanged portion 232 of the filter supporting member 230 and the inner wall surface 3b of the housing 3.

The air breathing filter 202 is composed of the above explained parts, which are assembled together as below. At first, the cylindrical portion 234 of the filter supporting member 230 is inserted into the through-hole 5 of the housing 3 from the inside of the housing 3. More exactly, the upper-end portion of the cylindrical portion 234 is outwardly projected from the outer wall surface 3a of the housing 3 in the upward direction, in order that each of the filter-body-side fitting portions 240 (the recessed portions 240a to 240c) as well as each of the arm portions 242 (the arm portions 242a to 242c) are located at the respective positions above the upper-side end of the through-hole 5. Each of the forward ends of the arm portions 242a to 242c is in contact with the outer wall surface 3a of the housing 3 so that the arm portions 242 (242a to 242c) are supported by the outer wall surface 3a. In other words, each of the arm portions 242a to 242c pushes the outer wall surface 3a in the downward direction. The arm portions 242a to 242c are also referred to as the pushing portions.

Then, the filter cover member 210, which is arranged at the outside of the housing 3, is assembled to the filter supporting member 230 fixed to the housing 3 as above. More exactly, each of the click portions 222a to 222c of the respective leg portions 220a to 220c is respectively fitted into each of the recessed portions 240a to 240c, which are formed in the outer peripheral surface 234a of the cylindrical portion 234 at the positions above the upper-side end of the through-hole 5. Accordingly, the filter cover member 210 is fixed to the filter supporting member 230.

As above, in the assembled condition, each of the arm portions 242 (that is, the pushing portions 242a to 242c) pushes the housing 3 from the outside thereof in the downward direction, so that the wall portion of the housing 3 and the water-proof sealing member 7 are interposed between the arm portions 242 (the pushing portions 242a to 242c) and the flanged portion 232, which is located inside of the housing 3. More exactly, the water-proof sealing member 7 is interposed in the compressed condition between the inner wall surface 3b of the housing 3 and the upper-side surface 232a of the flanged portion 232. When the water-proof sealing member 7 is held in the compressed condition, as shown in FIG. 5, the upper-side portion of the water-proof sealing member 7 is tightly in contact with the inner wall surface 3b of the housing 3, while the lower-side portion of the water-proof sealing member 7 is tightly in contact with the upper-side surface 232a of the flanged portion 232. The inner-peripheral side portion of the water-proof sealing member 7 is tightly in contact with the outer peripheral surface 234a of the cylindrical portion 234. According to the above sealing structure (the tight contacts at three portions), the gap between the housing 3 and the filter supporting member 230 is surely sealed by the water-proof sealing member 7.

As above, the same advantages to the first embodiment can be also obtained in the second embodiment.

In addition, a height H2 of the water-shedding film 50 between the outer wall surface 3a of the housing 3 and the upper-side surface 50a of the water-shedding film 50 is preferably larger than the height Ha (which is the height of the water drop W, as shown in FIG. 4B). According to the above feature (H2>Ha), the water attached to the outer wall surface 3a of the housing 3 may hardly flow to the upper-side surface 50a of the water-shedding film 50. It is, therefore, possible to more surely suppress the accumulation of the water on the upper-side surface 50a of the water-shedding film 50. It is, therefore, possible to further increase the air ventilation characteristic and the water-proof property.

Third Embodiment

A third embodiment of the present disclosure will be explained with reference to FIG. 7.

An electronic control device 301 of the third embodiment is different from the first embodiment in a structure of a housing 303. The air breathing filter 2 of the third embodiment is the same to that of the first embodiment.

In the electronic control device 301, the air breathing filter 2 is attached to the housing 303 having the water-proof structure. An upper-side portion of the housing 303, which is a portion above a heavy two-dot-chain line Y in FIG. 7, is different from that of the housing 3 of the first embodiment. More exactly, a stepped portion is formed on an outer wall surface 303a around an upper-side end of a through-hole 305. The through-hole 305 is formed in the wall portion of the housing 303 in order that the inside space of the housing 303 is communicated to the outside of the housing 303.

The outer wall surface 303a of the housing 303 has an upper-side surface 304b around a supporting surface 304a, which is formed in an area of the outer wall surface 303a surrounding the upper-side end of the through-hole 305. Each of the lower-side leg portions 24 of the leg portions 20 is in contact with the supporting surface 304a so that the supporting surface 304a receives a pushing force from each of the lower-side leg portions 24 (the pushing portions 24a to 24c). The upper-side surface 304b is formed in the outer wall surface 303a at a position higher than the supporting surface 304a. Therefore, the supporting surface 304a and a part of the upper-side surface 304b surrounding the supporting surface 304a are formed in a step shape in an area (a filter fitting area) directly below the cover plate portion 12 of the filter cover member 10. The supporting surface 304a is formed by a flat surface extending in the horizontal direction. The upper-side surface 304b is also formed by a flat surface extending in the horizontal direction.

The air breathing filter 2 used in the third embodiment is identical to that of the first embodiment. A structure for fixing the air breathing filter 2 to the through-hole 305 of the housing 303 is identical to that of the first embodiment. In other words, the same advantages to those of the air breathing filter 2 of the first embodiment can be obtained in the third embodiment, too.

The air breathing filter 2 of the electronic control device 301, which is provided in order to bring out the air ventilation characteristic and the water-proof property for the housing 303, is composed of the filter supporting member 30, the filter cover member 10, the water-shedding film 50, and the water-proof sealing member 7. The filter supporting member 30 is composed of the cylindrical portion 34, multiple filter-body-side fitting portions 40 (the recessed portions 40a to 40c) and the flanged portion 32. The cylindrical portion 34 is formed in the cylindrical shape having the air passage 38 inside thereof. The filter-body-side fitting portions 40 are formed at the upper-end portion of the cylindrical portion 34. The flanged portion 32 is formed at the lower-end portion of the cylindrical portion 34 and extending from the outer peripheral surface 34a of the cylindrical portion 34 in the radial-outward direction. The filter supporting member 30 is inserted into the through-hole 305 of the housing 303 from the inside of the housing 303.

In the present embodiment, the cylindrical portion 34 of the filter supporting member 30 (including the air passage 38) also extends in the vertical direction. The center axis C of the cylindrical portion 34 corresponds to the vertical direction. The water-shedding film 50 is provided at the upper end 34c of the cylindrical portion 34, while the flanged portion 32 is formed at the lower end of the cylindrical portion 34. The upper-side surface 32a of the flanged portion 32 extends in the radial-outward direction perpendicular to the center axis C, that is, in the horizontal direction.

The water-shedding film 50, which is identical to that of the first embodiment, is attached to the upper end 34c of the cylindrical portion 34 so as to close the air passage 38. In the present embodiment, the upper-end portion of the cylindrical portion 34 is also outwardly projected from the outer wall surface 303a (the supporting surface 304a) of the housing 303 in the upward direction in the filter fitting area directly below the cover plate portion 12 of the filter cover member 10. More exactly, the upper-end portion of the cylindrical portion 34 is outwardly projected from the supporting surface 304a and the part of the upper-side surface 304b directly located below the cover plate portion 12 (the part of the upper-side surface 304b covered by the cover plate portion 12 when viewed it from the upper side of the electronic control device 301 in the vertical direction). The water-shedding film 50 is located at a position above the supporting surface 304a and the part of the upper-side surface 304b, which are formed below the cover plate portion 12.

The filter cover member 10 is composed of the cover plate portion 12 covering the water-shedding film 50, the leg portions 20 extending from the cover plate portion 12, and the cover-side fitting portions 22, each of which is integrally formed with the respective leg portion 20 (20a to 20c) and fitted into the filter-body-side fitting portions 40 (the respective recessed portions 40a to 40c). Each of the leg portions 20a to 20c extends from the lower-side surface 12b of the cover plate portion 12 of the filter cover member 10 in the downward direction. Each of the cover-side fitting portions 22 has the same structure to that of the fitting portion 22 of the first embodiment. More exactly, each of the cover-side fitting portions 22 has the click portion 22a/22b/22c, which is formed as the projection in the respective leg portion 20a/20b/20c.

The water-proof sealing member 7 is composed of the same O-ring to that of the first embodiment. In the assembled condition, the water-proof sealing member 7 is arranged along the outer peripheral surface 34a so as to surround the cylindrical portion 34. The water-proof sealing member 7 is held in the compressed condition interposed between the flanged portion 32 of the filter supporting member 30 and an inner wall surface 303b of the housing 303.

The air breathing filter 2 is composed of the above explained parts, which are assembled together as below. At first, the cylindrical portion 34 of the filter supporting member 30 is inserted into the through-hole 305 of the housing 303 from the inside of the housing 303. More exactly, the upper-end portion of the cylindrical portion 34 is outwardly projected from the outer wall surface 303a of the housing 303 in the upward direction, in order that each of the filter-body-side fitting portions 40 (the recessed portions 40a to 40c) is located at the position above the upper-side end of the through-hole 305. Then, the filter cover member 10 is assembled to the filter supporting member 30 from the outside of the housing 303. In the same manner to the first embodiment, each of the click portions 22a to 22c of the leg portions 20a to 20c is fitted into the respective recessed portions 40a to 40c so as to fix the filter cover member 10 to the filter supporting member 30.

Figure 7:
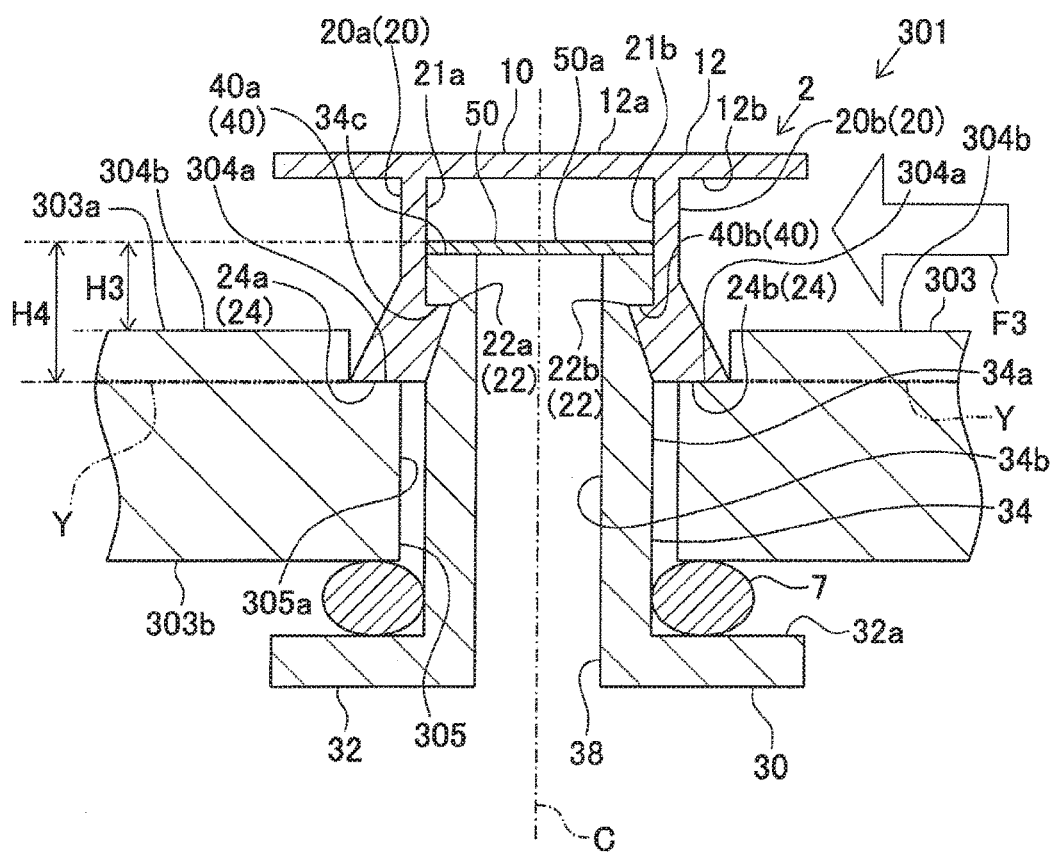
FIG. 7 is a schematic cross sectional view showing a structure of a relevant portion of an electronic control device according to a third embodiment of the present disclosure.

In the assembled condition, as shown in FIG. 7, each of the lower-side leg portions 24 (the pushing portions 24a to 24c) of the leg portions 20a to 20c is in contact with and supported by the outer wall surface 303a of the housing 303 (more exactly, the supporting surface 304a), so that each of the lower-side leg portions 24 pushes the supporting surface 304a from the outside of the housing 303. In addition, the wall portion of the housing 303 and the water-proof sealing member 7 are interposed between the lower-side leg portions 24 located at the outside of the housing 303 and the flanged portion 32 located at the inside of the housing 303.

More exactly, the water-proof sealing member 7 is interposed between the inner wall surface 303b of the housing 303 and the flanged portion 32. As shown in FIG. 7, the water-proof sealing member 7 is held in the compressed condition. In such a compressed condition of the water-proof sealing member 7, the upper-side portion of the water-proof sealing member 7 is tightly in contact with the inner wall surface 303b of the housing 303, while the lower-side portion of the water-proof sealing member 7 is tightly in contact with the upper-side surface 32a of the flanged portion 32. In addition, the inner-peripheral side portion of the water-proof sealing member 7 is tightly in contact with the outer peripheral surface 34a of the cylindrical portion 34. According to the above structure (the tight contacts at three portions), the gap between the housing 303 and the filter supporting member 30 is tightly sealed.

As above, the same advantages to the first embodiment can be also obtained in the electronic control device 301 of the third embodiment.

In addition, in the housing 303 of the present embodiment, the supporting surface 304a and the upper-side surface 304b are formed in the stepped shape, wherein the supporting surface 304a receives the pushing forces from the forward end portions (the pushing portions) 24a to 24c of the leg portions 20a to 20c and the part of the upper-side surface 304b surrounding the supporting surface 304a is located at the position higher than the supporting surface 304a. According to the above structure, it is possible to reduce the external force to be applied to the respective leg portions 20a to 20c. In particular, the external force to be applied to the forward end portions (the pushing portions) 24a to 24c can be reduced. For example, in a case that the high-pressure water hits against the air breathing filter 2 at its side portion, as indicated by an arrow F3, a large external force may not be applied to the forward end portions 24a to 24c below the upper-side surface 304b. Therefore, the filter cover member 10 and the cylindrical portion 34 are not likely to be deformed. It is, therefore, possible to maintain the air breathing filter 2 in its natural condition, as shown in FIG. 7. As a result, high water-proof performance can be obtained in the area neighboring to the water-proof sealing member 7.

In addition, a height H4 of the water-shedding film 50 between the supporting surface 304a of the housing 303 and the upper-side surface 50a of the water-shedding film 50 is preferably larger than the height Ha (which is the height of the water drop W, as shown in FIG. 4B). Furthermore, a height H3 of the water-shedding film 50 between the upper-side surface 304b of the housing 303 and the upper-side surface 50a of the water-shedding film 50 is preferably larger than the height Ha of the water drop W.

According to the above feature (H4>Ha), the water attached to the upper-side surface 304b of the housing 303 may hardly flow to the upper-side surface 50a of the water-shedding film 50. It is, therefore, possible to more surely suppress the accumulation of the water on the upper-side surface 50a of the water-shedding film 50. It is, therefore, possible to further increase the air ventilation characteristic and the water-proof property. In a case that the height Further Embodiments and/or Modifications The present disclosure is not limited to the above embodiments which are explained with reference to the drawings, but can be modified in various manners without departing from a spirit of the present disclosure. For example, the following modifications are included in the scope of protection of the present disclosure:

(M1) In the above embodiments, the electronic control device is applied to the engine ECU. However, the electronic control device of the present disclosure may be applied to any other electronic control units installed in the vehicle, such as, a body ECU, a Brake ECU, an air-bag ECU and so on.

(M2) In the above embodiments, one single air breathing filter is provided in the housing. However, two or more than two air breathing filters may be provided in the housing.

(M3) In the above embodiments, the recessed portions are formed in the cylindrical portion as the filter-body-side fitting portions, while the click portions of the projection shape are formed in the leg portions of the filter cover member as the cover-side fitting portions. However, the filter-body-side fitting portions may be formed by the click portions of the projection shape in the filter supporting member, while the recessed portions may be formed in the leg portions of the filter cover member.

What is claimed is:

1. An electronic control device, which has a housing of a water-proof structure, comprising:
    a through-hole formed in a wall of the housing so as to communicate an inside space formed in the housing to an outside of the housing; and
    an air breathing filter assembled to the housing,
    wherein the air breathing filter comprises;
    (a) a filter supporting member having;
    (a1) a cylindrical portion formed in a cylindrical shape and having an air passage formed inside of the cylindrical portion and extending in an axial direction of the cylindrical portion;
    (a2) a fitting portion formed in an outer peripheral surface of the cylindrical portion at a position close to a first axial end of the cylindrical portion; and
    (a3) a flanged portion formed at a second axial end of the cylindrical portion and extending in a radial-outward direction of the cylindrical portion from the outer peripheral surface of the cylindrical portion;
    (b) a water-shedding film attached to the first axial end of the cylindrical portion so as to close an open end of the air passage;
    (c) a filter cover member, which is fixed to the filter supporting member and composed of;
    (c1) a cover plate portion covering the water-shedding film;
    (c2) a leg portion extending from the cover plate portion in a direction to the filter supporting member; and
    (c3) a fitting portion integrally formed with the leg portion and fitted to the fitting portion of the filter supporting member; and
    (d) a water-proof sealing member formed in an annular shape,
    wherein the filter supporting member is inserted into the trough-hole from the inside space of the housing, the filter cover member is assembled to the filter supporting member from the outside of the housing, a pushing portion is formed either in the filter cover member or in the filter supporting member, the pushing portion is supported by the outer peripheral surface of the cylindrical portion, the water-proof sealing member surrounds the outer peripheral surface of the cylindrical portion and is interposed between an inner wall surface of the housing and the flanged portion.

2. The electronic control device according to claim 1, wherein
    the fitting portion of the filter supporting member is composed of a recessed portion, which is formed in the outer peripheral surface of the cylindrical portion, so that the recessed portion is recessed from the outer peripheral surface in a radial-inward direction of the cylindrical portion,
    the pushing portion is formed as a part of the filter cover member for pushing the housing from the outside thereof, and
    the wall of the housing and the water-proof sealing member are interposed between the pushing portion and the flanged portion.

3. The electronic control device according to claim 1, wherein
    the axial direction of the cylindrical portion extends in a vertical direction, so that the first axial end of the cylindrical portion to which the water-shedding film is attached is arranged at an upper side of the cylindrical portion and that the second axial end of the cylindrical portion at which the flanged portion is formed is arranged at a lower side of the cylindrical portion, and
    an outer wall surface of the housing is composed of a supporting surface and an upper-side surface,
    wherein the supporting surface is formed at a position neighboring to an upper-side end of the through-hole and receives a pushing force from the pushing portion,
    wherein the upper-side surface is formed in an area surrounding the supporting surface and located at a position higher than the supporting surface, so that the supporting surface and the upper-side surface are formed in a stepped shape, and
    wherein the pushing portion is in contact with and supported by the supporting surface of the outer wall surface.

4. The electronic control device according to claim 1, wherein
    the axial direction of the cylindrical portion extends in a vertical direction, so that the first axial end of the cylindrical portion to which the water-shedding film is attached is arranged at an upper side of the cylindrical portion and that the second axial end of the cylindrical portion at which the flanged portion is formed is arranged at a lower side of the cylindrical portion, and
    an upper-end portion of the cylindrical portion is outwardly projected in the axial direction from an outer wall surface of the housing, and
    the water-shedding film, which is attached to the first axial end of the cylindrical portion, is located at a position above the outer wall surface of the housing.

5. An electronic control device, which has a housing of a water-proof structure, comprising:
    a through-hole formed in a wall of the housing so as to communicate an inside space formed in the housing to an outside of the housing; and
    an air breathing filter assembled to the housing,
    wherein the air breathing filter comprises;
    (a) a filter supporting member having;

(a1) a cylindrical portion formed in a cylindrical shape and having an air passage formed inside of the cylindrical portion and extending in an axial direction of the cylindrical portion;

(a2) multiple recessed portions formed as fitting portions on an outer peripheral surface of the cylindrical portion at a position close to an upper-side axial end of the cylindrical portion; and (a3) a flanged portion formed at a lower-side axial end of the cylindrical portion and extending in a radial-outward direction of the cylindrical portion from the outer peripheral surface of the cylindrical portion;

(b) a water-shedding film attached to the upper-side axial end of the cylindrical portion so as to close an upper-side open end of the air passage;

(c) a filter cover member, which is fixed to the filter supporting member and composed of;

(c1) a cover plate portion covering the water-shedding film in a vertical direction;

(c2) multiple leg portions extending from the cover plate portion in a downward direction to the filter supporting member; and (c3) a click portion formed as a fitting portion in each of the leg portions and fitted to the respective recessed portions of the filter supporting member; and (d) a water-proof sealing member formed in an annular shape, wherein the cylindrical portion of the filter supporting member is inserted into the trough-hole from the inside space of the housing, the filter cover member is assembled to the cylindrical portion of the filter supporting member from the outside of the housing, a pushing portion is formed in each of the leg portions of the filter cover member, the pushing portion is in contact with and supported by an outer wall surface of the housing in the vertical direction so as to push the wall of the housing in the downward direction, the water-proof sealing member surrounds the outer peripheral surface of the cylindrical portion and is interposed between an inner wall surface of the housing and the flanged portion of the filer supporting member.

6. An electronic control device, which has a housing of a water-proof structure, comprising:

a through-hole formed in a wall of the housing so as to communicate an inside space formed in the housing to an outside of the housing; and an air breathing filter assembled to the housing, wherein the air breathing filter comprises;

(a) a filter supporting member having;

(a1) a cylindrical portion formed in a cylindrical shape and having an air passage formed inside of the cylindrical portion and extending in an axial direction of the cylindrical portion;

(a2) multiple recessed portions formed as fitting portions on an outer peripheral surface of the cylindrical portion at a position close to an upper-side axial end of the cylindrical portion;

(a3) a flanged portion formed at a lower-side axial end of the cylindrical portion and extending in a radial-outward direction of the cylindrical portion from the outer peripheral surface of the cylindrical portion; and (a4) multiple arm portions formed on the outer peripheral surface of the cylindrical portion at a position between the recessed portions and the flanged portion in the axial direction;

(b) a water-shedding film attached to the upper-side axial end of the cylindrical portion so as to close an upper-side open end of the air passage;

(c) a filter cover member, which is fixed to the filter supporting member and composed of;

(c1) a cover plate portion covering the water-shedding film in a vertical direction;

(c2) multiple leg portions extending from the cover plate portion in a downward direction to the filter supporting member; and (c3) a click portion formed as a fitting portion in each of the leg portions and fitted to the respective recessed portions of the filter supporting member; and (d) a water-proof sealing member formed in an annular shape, wherein the cylindrical portion of the filter supporting member is inserted into the trough-hole from the inside space of the housing, the filter cover member is assembled to the cylindrical portion of the filter supporting member from the outside of the housing, each of the arm portions is formed as a pushing portion which extends in the radial-outward direction so that each of the pushing portions is in contact with and supported by an outer wall surface of the housing in the vertical direction so as to push the wall of the housing in the downward direction, the water-proof sealing member surrounds the outer peripheral surface of the cylindrical portion and is interposed between an inner wall surface of the housing and the flanged portion of the filter supporting member.

\* \* \* \* \*